(12) United States Patent
Grad et al.

(10) Patent No.: US 11,804,709 B2
(45) Date of Patent: Oct. 31, 2023

(54) ESD PROTECTION CIRCUIT WITH GIDL CURRENT DETECTION

(71) Applicant: NXP B.V., Eindhoven (NL)

(72) Inventors: Marcin Grad, Bemmel (NL); Chinmayee Kumari Panigrahi, Bangalore (IN); Maciej Skrobacki, Heteren (NL)

(73) Assignee: NXP B.V., Eindhoven (NL)

( * ) Notice: Subject to any disclaimer, the term of this patent is extended or adjusted under 35 U.S.C. 154(b) by 103 days.

(21) Appl. No.: 17/452,875

(22) Filed: Oct. 29, 2021

(65) Prior Publication Data

US 2023/0139245 A1 May 4, 2023

(51) Int. Cl.
*H02H 9/04* (2006.01)
*H02H 1/00* (2006.01)

(52) U.S. Cl.
CPC .......... *H02H 9/046* (2013.01); *H02H 1/0007* (2013.01)

(58) Field of Classification Search
CPC ............................. H02H 9/046; H02H 1/0007
USPC ........................................................ 361/56
See application file for complete search history.

(56) References Cited

U.S. PATENT DOCUMENTS

| | | | |
|---|---|---|---|
| 6,404,269 B1 | 6/2002 | Voldman | |
| 6,873,562 B2 | 3/2005 | Koelling et al. | |
| 7,215,146 B2 | 5/2007 | Khan | |
| 7,359,271 B2 | 4/2008 | Schneider et al. | |
| 7,417,481 B2 | 8/2008 | Ahsanullah et al. | |
| 7,639,066 B2 | 12/2009 | Harald | |
| 7,675,345 B2 | 3/2010 | Fayed | |
| 8,669,803 B2 | 3/2014 | Huang et al. | |
| 10,158,354 B2 | 12/2018 | Dutta et al. | |
| 10,878,854 B2 | 12/2020 | Pan et al. | |
| 10,972,096 B2 | 4/2021 | Mertens et al. | |
| 11,251,782 B1 | 2/2022 | Grad et al. | |
| 2005/0237681 A1* | 10/2005 | Chen | H02H 9/046 361/56 |
| 2017/0221879 A1* | 8/2017 | Wang | H01L 27/0288 |
| 2020/0251466 A1* | 8/2020 | Stockinger | H01L 27/0727 |

FOREIGN PATENT DOCUMENTS

| | | | | |
|---|---|---|---|---|
| CN | 114783994 A | * | 7/2022 | ......... H01L 27/0262 |
| EP | 3200228 A1 | * | 8/2017 | ......... H01L 27/0285 |
| EP | 3693994 A1 | * | 8/2020 | ......... H01L 27/0255 |

OTHER PUBLICATIONS

Dagan, H., "A GIDL Free Tunneling Gate Driver for a Low Power Non-Volatile Memory Array", 2012 IEEE International Symposium on Circuits and Systems, May 20-23, 2012.
Panigrahi, C., "Leakage Optimization of Thick Oxide IO/ESD Transistors in 40nm Global Foundry Process", 2017 IEEE International Conference on Consumer Electronics-Asia (ICCE-Asia), Oct. 5-7, 2017.
U.S. Appl. No. 18/163,347, filed Feb. 2, 2023, and entitled "Level Shifter With GIDL Current Reduction".

* cited by examiner

*Primary Examiner* — Dharti H Patel
(74) *Attorney, Agent, or Firm* — David G. Dolezal

(57) ABSTRACT

An ESD protection circuit that includes a clamp path including two clamp transistors and a GIDL detection circuit for detecting GIDL current conditions in the ESD protection circuit. The GIDL detection circuit generates a signal indicative of a GIDL current condition. The signal is utilized to control a voltage of a control electrode of a clamp transistor of the clamp path to increase the conductivity of the clamp transistor when the signal is indicative of a GIDL current condition to minimize a GIDL current through at least through a portion of the clamp path when the second clamp transistor is nonconductive where no ESD current is being discharged through the clamp path.

20 Claims, 4 Drawing Sheets

ESD PROTECTION CIRCUIT WITH GIDL CURRENT DETECTION

BACKGROUND OF THE INVENTION

Field of the Invention

This invention relates to ESD protection circuits with GIDL current detection.

Background

An ESD (Electrostatic discharge) protection circuit is utilized for protecting circuits from ESD events. An ESD event may occur when a charged object (e.g. a human finger) inadvertently contacts a conductive surface of an integrated circuit (e.g. a contact pad) or a conductive surface of an integrated circuit package coupled to the pad where charge at an elevated voltage is applied to the conductive surface due to the contact. Being at an elevated voltage, such charge may cause voltage differentials across the devices of the integrated circuit that may exceed their safe operating areas and damage those devices. An ESD event may also occur when a charged conductive surface of a circuit contacts an external object where charge is transferred between the conductive surface and the external object. Some ESD protection circuits include clamp paths for discharging current from an ESD event from a pad to a ground rail.

FIGS. 1 and 2 show two different circuits 101 and 201 that include similar circuitry. Assuming node 102 is biased at a higher voltage than node 104, circuit 101 of FIG. 1 is configured where NFETs 103 and 105 are conductive to provide a current path for charge to flow from node 102 to 104. In FIG. 1, PFET 113 is biased at the lower voltage of node 104 to be conductive to pull the gate of NFET 103 high to make NFET 103 conductive. The gate of NFET 105 is biased at the higher voltage of node 102 to make NFET 105 conductive.

With circuit 201 of FIG. 2, the gate of NFET 105 is biased at the lower voltage of node 104 such that NFET 105 is nonconductive. The gate of PFET 113 is biased at the higher voltage of node 102 such that PFET 113 is nonconductive. The gate of PFET 111 is biased at the lower voltage of node 104 such that it is conductive where the gate of NFET 103 is equal to the source (node 203) of NFET 103.

With NFET 105 being nonconductive, no current should flow from node 102 to node 104. However, under certain conditions, leakage current may flow through NFET 105. Circuits 101 and 201 include a stack of diode configured PFETs 108, 109, and 110 that are coupled to node 203 through PFET 111. If there is no leakage current through NFET 105, then the voltage of the gate of NFET 103 would be close to the voltage of node 102, and NFET 103 would be nonconductive in that the voltage of node 203 would be close to voltage of the gate of NFET 103 via a conductive PFET 111.

However, if there is leakage current through NFET 105, then the voltage of node 203 will decrease to approximately a voltage of three diode voltage drops (of diode configured PFETs 108, 109, and 110) below the voltage of node 102. Thus, if there is leakage current through NFET 105, PFETs 108-110 act to hold the voltage of node 203 at a particular value to prevent leakage from node 102 through NFET 103.

The conductivity of NFET 103 does not change in response to leakage current through NFET 105. NFET 103 remains non conducive in that its source (node 203) and gate remain at relatively the same voltage via a conductive PFET 111.

One issue with the circuit of FIG. 2 is that under some conditions, GIDL current through NFET 103 may not flow through NFET 105 as leakage current. In such a condition, the GIDL current would flow from the drain of NFET 103 through its body electrode to node 104. Furthermore, the leakage current detection system is not independent of the current path through NFETs 103 and 105, which may present difficulty in connecting the leakage current detection circuit to node 203 in some embodiments, especially at smaller nodes (e.g. 16 nm and below) implemented with FinFETs.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is an ESD protection circuit that includes a clamp path with two clamp transistors and a GIDL detection circuit for detecting GIDL current conditions in the ESD protection circuit. The GIDL detection circuit generates a signal indicative of a GIDL current condition. The signal is utilized to control a voltage of a control electrode of a clamp transistor of the clamp path to increase the conductivity of the clamp transistor when the signal is indicative of a GIDL current condition to minimize a GIDL current through at least through a portion of the clamp path when the second clamp transistor is nonconductive where no ESD current is being discharged through the clamp path. In some embodiments, the signal is utilized to reduce the magnitude of the drain-gate voltage of the clamp transistor when the signal is indicative of a GIDL current condition to minimize GIDL current through the clamp transistor.

In some embodiments, providing an ESD protection circuit with a GIDL detection circuit may provide for an ESD protection circuit that can prevent GIDL leakage current from being discharged to the discharge node when no ESD event is occurring. Accordingly, implementing such a GIDL detection circuit may prevent the ESD protection circuit from unnecessarily consuming power due to GIDL leakage current when no ESD event is occurring.

Figure 1:
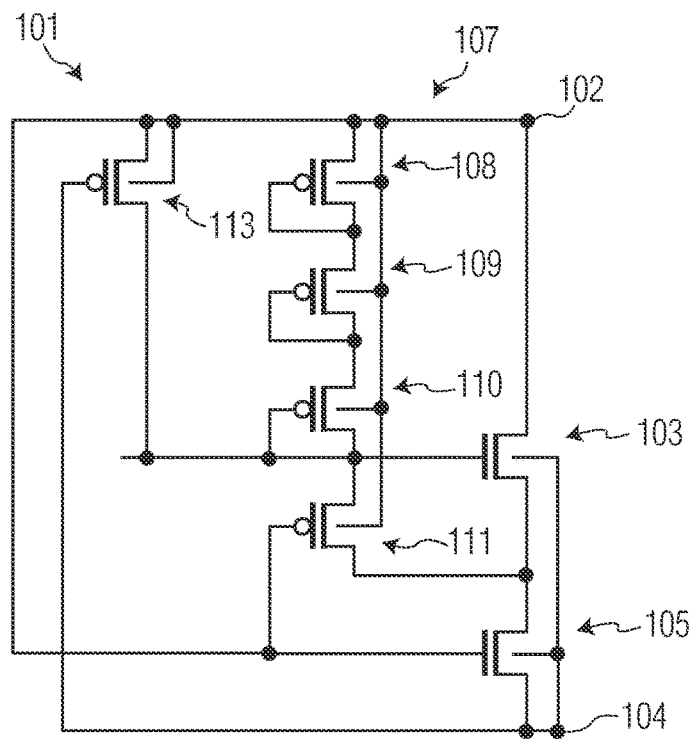
FIG. 1 is a circuit diagram of a prior art circuit.
Figure 2:
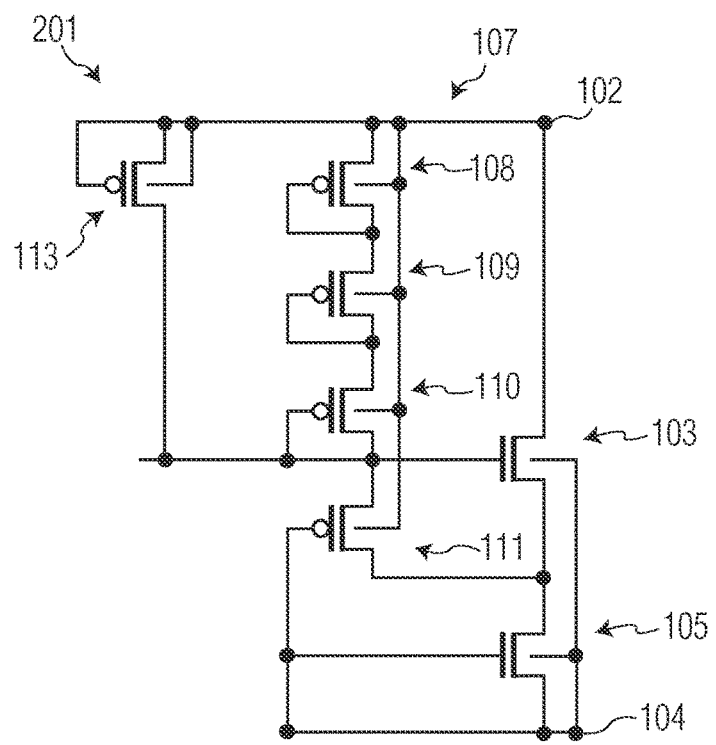
FIG. 2 is a circuit diagram of a prior art circuit.
Figure 3:
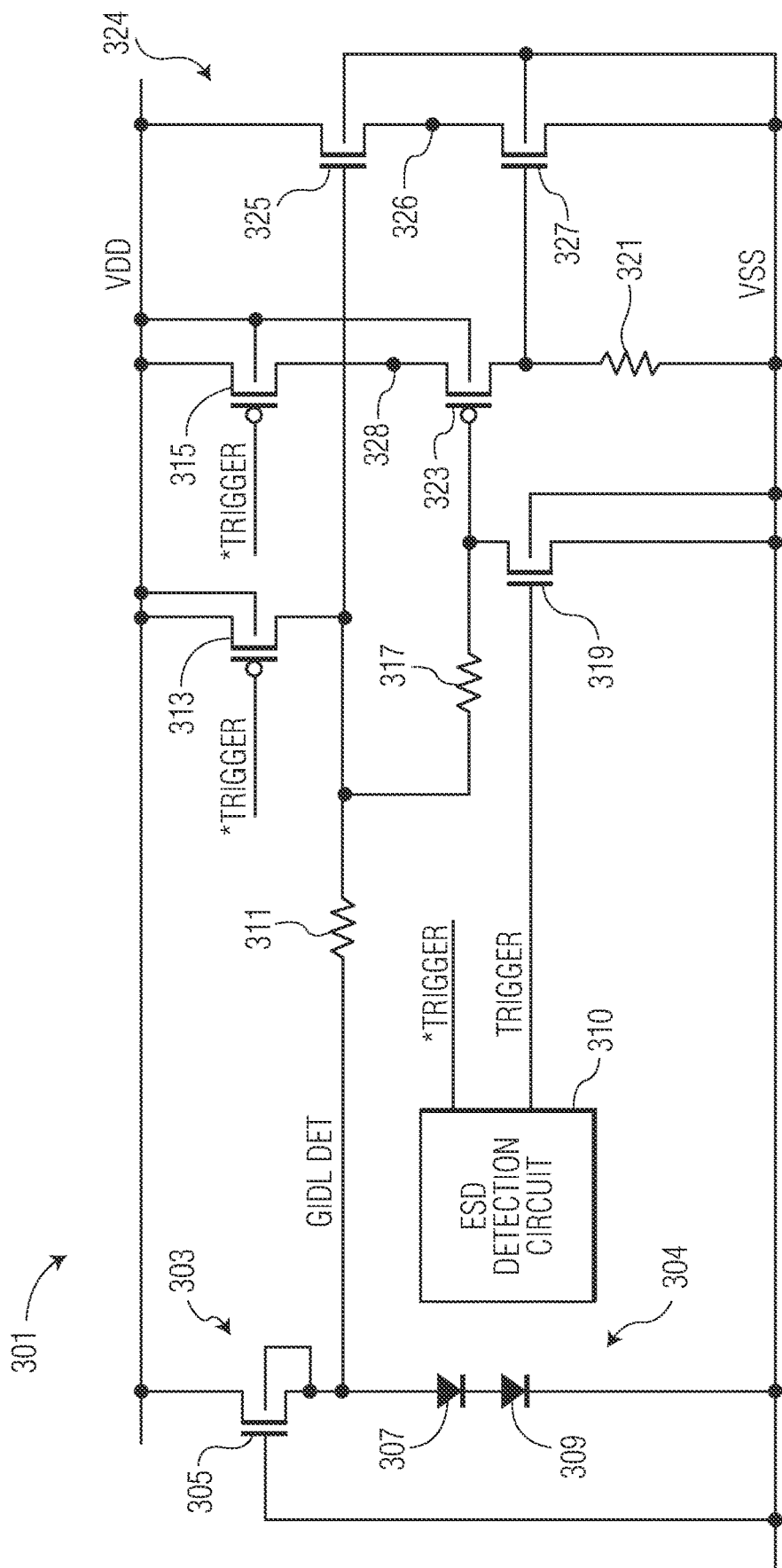
FIG. 3 is a circuit diagram of an ESD protection circuit according to one embodiment of the present invention.

FIG. 3 is a circuit diagram of an ESD protection circuit 301 of an integrated circuit according to one embodiment of the present invention. Circuit 301 includes an ESD detection circuit 310 which is coupled to a power supply rail VDD to monitor for an ESD event that affects rail VDD. In one example, an ESD event affecting rail VDD may occur when a charged object contacting a pad of a packaged integrated circuit coupled to rail VDD transfers a charge through the pad to rail VDD which creates a voltage differential between rails VDD and power supply ground rail VSS that may damage circuitry of the integrated circuit. In response to the detection of an ESD event, circuit 310 asserts detection signals TRIGGER and *TRIGGER (which is an inverted signal of TRIGGER). In one embodiment, detection circuit 310 includes a slew rate detection circuit (not shown) that determines when an ESD event affects rail VDD when the rise in the voltage differential between power supply rails VDD and VSS exceeds a particular rate (e.g. a rate greater than a normal power up event). However, other types of detection circuits may be used in other embodiments.

ESD circuit 301 includes a clamp path 324 that is made conductive by the assertion of the TRIGGER and *TRIGGER signals to discharge ESD current due to an ESD event from rail VDD to rail VSS. In the embodiment shown, clamp path 324 includes two clamp devices, NFET 325 and NFET 327. In the embodiment shown, the drain of NFET 325 is connected to rail VDD, the source of NFET 325 is connected to the drain of NFET 327 at node 326, the gate of NFET 325 is connected to resistor 311 and the drain of PFET 313, and the body electrode of NFET 325 is connected to rail VSS. The gate of NFET 327 is connected to the drain of PFET 323 and resistor 321. The source of NFET 327 is connected to rail VSS, and the body electrode of NFET 327 is connected to rail VSS. Although in FIG. 3 circuit 301 detects an ESD event and discharges current from a power supply rail (VDD), in other embodiments, circuit 301 may detect an ESD event and discharge ESD current from a signal line coupled to a signal pad (e.g. an I/O pad of an integrated circuit) where circuit 301 (including clamp path 324) is connected to the signal line.

During the detection of an ESD event affecting rail VDD, detection circuit 310 asserts the TRIGGER signal at a high voltage level and the *TRIGGER signal at a low voltage level to make clamp path 324 conductive by making NFETs 325 and 327 conductive to discharge ESD current from power supply rail VDD to power supply ground rail VSS. Specifically, the high voltage of the TRIGGER signal makes NFET 319 conductive to pull the voltage of the gate of PFET 323 to VSS to make PFET 323 conductive. The *TRIGGER signal being at an asserted low voltage level makes PFET 313 conductive to pull voltage of the gate of NFET 325 to a high voltage level to make NFET 325 conductive. The *TRIGGER signal being at an asserted low voltage makes PFET 315 conductive. With PFETs 315 and 323 being conductive, the voltage of the gate of NFET 327 is pulled to VDD to make NFET 327 conductive. During an ESD condition, resistor 321 provides a voltage differential between the gate of NFET 327 and rail VSS, and resistor 317 provides a voltage differential between the gate of NFET 325 and rail VSS through conductive NFET 319. As shown in FIG. 3, the body electrodes of PFETs 313, 315, and 323 are tied to rail VDD, and the body electrode of NFET 319 is tied to rail VSS.

After circuit 310 no longer detects an ESD event affecting rail VDD, the TRIGGER and *TRIGGER signals are no longer at asserted voltages. With the *TRIGGER signal being at a non asserted high voltage level, PFETs 313 and 315 are no longer conductive. Accordingly, the gate of NFET 327 is no longer pulled to VDD through PFETs 315 and 323. Instead the gate of NFET 327 is pulled to VSS though resistor 321. With PFET 313 no longer conductive, the gate of NFET 325 no longer is pulled to rail VDD. Also, NFET 319 is no longer conductive such that the gate of PFET 323 is not pulled to VSS. In this state, the conductivity of NFET 325 is controlled by the GIDL DET signal, which will be explained later.

One issue that may occur in a clamp path is that gate-induced drain leakage (GIDL) current may occur in certain conditions in the clamp path 324 when the clamp path is intended to be nonconductive when no ESD event is occurring. GIDL current is a leakage current that flows from the drain to the body of a FET that occurs due to a high electric field between the gate and the drain of a FET when the drain to gate voltage is above a GIDL voltage for an NFET or below the GIDL voltage for a PFET. For a PFET, the GIDL voltage is typically negative. GIDL current in an ESD clamp path may increase the amount of power consumed by the integrated circuit. In some embodiments, GIDL current is becoming more of an issue as process node sizes decrease.

Some prior art solutions for controlling GIDL current include continuously biasing a first FET located between a high voltage source and the drain of a second FET at a voltage that makes the first FET conductive so as to reduce the voltage that is applied at the drain of the second FET so that GIDL current does not flow through the second FET. However, this static biasing of a FET in a path consumes power even when there are no GIDL current conditions. Accordingly, this may not be practical or desirable in some applications such as in low power applications.

Accordingly, circuit 301 includes a GIDL detection circuit 303 that is used to provide a signal (GIDL DET) that indicates that circuit 301 may be subject to conditions that would generate GIDL current between rail VDD and rail VSS. When GIDL current conditions are present, the GIDL DET signal is used to make NFET 325 conductive to provide a voltage at node 326 that is less than the voltage of rail VDD so as to inhibit GIDL current from flowing from the drain of NFET 327 through its body electrode to VSS when no ESD event is being detected by the detection circuit 310. In addition, the GIDL DET signal being asserted at a high voltage reduces the magnitude of the drain-gate voltage of NFET 325 thereby reducing GIDL current through NFET 325.

GIDL detection circuit 303 includes a detection transistor (NFET 305) located in a current path 304 from rail VDD to rail VSS that is biased in a nonconductive state such that a GIDL current will be produced from its drain connected to rail VDD to its body electrode that is connected to its source if the conditions in the circuit are such that GIDL current is likely to be produced in the clamp path 324. The gate of NFET 305 is biased at VSS to place NFET 305 in a nonconductive state.

Detection circuit 303 includes two diodes 307 and 309 that are coupled in current path 304 along with NFET 305. If GIDL conditions do exist where a GIDL current flows through NFET 305, the GIDL current will flow through diodes 307 and 309 such that a voltage (two diode voltage drops higher than VSS) is produced for the GIDL DET signal. If no GIDL current flows through NFET 305, then the voltage of GIDL DET is close to the voltage of VSS.

Some embodiments may include a different number of diodes depending upon the desired voltage of the GIDL DET signal when it indicates a GIDL current condition. In other embodiments, a resistor may be used in place of diodes 307 and 309. However, in some embodiments, diodes are preferable to resistors in that it provides a relatively constant voltage for an asserted GIDL DET signal indicating a GIDL current condition, regardless of the amount of GIDL current through NFET 305. In some embodiments a resistor may be placed in parallel with the diodes.

The GIDL DET signal being at a GIDL indicative voltage places NFET 325 in a conductive state to position the voltage of node 326 at an intermediate value between VDD and VSS. In one embodiment, NFET 325 acts as a source follower where the voltage at node 326 is a voltage threshold below the voltage of the GIDL DET signal when it indicates a GIDL current condition. Accordingly, the voltage that node 326 can be set at during a GIDL current condition is based upon the number and size of diodes 307 and 309 and the size of NFET 305 in the embodiment shown. In one embodiment, if rail VDD is biased at a voltage of 1.8 volts, node 326 is biased at 1.4 voltage during a GIDL current condition. However, these voltages may be of other values in other embodiments. In some embodiments, placing node 326 at a voltage between VDD and VSS significantly lowers the GIDL current flowing to VSS. In some simulation examples where circuit 303 was used to set the voltage of node 326 at an intermediate voltage during a GIDL current condition, the amount of GIDL current to VSS was 1/85 of the amount GIDL current produced during a simulation when the voltage of node 326 was not lowered.

During a GIDL current condition, the GIDL DET signal also biases PFET 323 at a voltage that makes PFET 323 act as a source follower to set the voltage at node 328 to a threshold voltage above the GIDL indication voltage of the GIDL DET signal. Setting the voltage of node 328 at a value between VSS and VDD prevents GIDL current from flowing through either PFET 323 or PFET 315 during GIDL current conditions. Else, GIDL current conditions through either of these transistors may cause a current through resistor 321, which may raise the voltage on the gate of NFET 327 that would undesirably cause NFET 327 to conduct during a time when no ESD event is occurring.

When no GIDL current condition exists, no GIDL current flows through NFET 305 and through diodes 307 and 309. Accordingly, the voltage of the GIDL DET signal is near VSS. At this voltage, NFET 325 is nonconductive. Also, if the GIDL DET signal is at or near the voltage of VSS, PFET 323 will be conductive. However, PFET 315 is nonconductive so that the gate of NFET 327 is not pulled to VDD.

Although in FIG. 3 ESD circuit 301 is used to detect and discharge ESD current on from an ESD event affecting a voltage supply rail, in other embodiments, ESD circuit 301 may be used to detect and discharge ESD current affecting other conductive structures of an integrated circuit including signal pads.

ESD circuit 301 may be part of a larger ESD protection circuit of an integrated circuit. For example, an integrated circuit may include multiple clamp paths with clamp transistors (similar to NFETs 325 and 327) located in various parts of the integrated circuit that are coupled between the VDD power rail and the VSS power rail. Also, other embodiments may include multiple detection circuits (similar to detection circuit 310) in various locations of an integrated circuit that monitor ESD events that affect power supply rails at other supply voltages. In some embodiments, the outputs of ESD detection circuit 310 (and the outputs of multiple detection circuits located around an integrated circuit in some embodiments) would be connected to a TRIGGER bus (not shown) (and a *TRIGGER bus in some embodiments) where each clamp path would be made conductive to dissipate the ESD current of an ESD event. In some embodiments, the GIDL detection circuits would be coupled to a GIDL DET signal bus (not shown) that would be coupled to the clamp transistor (similar to NFET 325) of each of the multiple clamp paths. Also, an integrated circuit may include multiple detection circuits and clamp paths for other power supply rails and for various signal paths. Furthermore, in some embodiments, a GIDL detection circuit may control the gates of clamp transistors of multiple clamp paths of an integrated circuit.

In one embodiment, circuit 301 is implemented in an integrated circuit where the rails VDD and VSS are connected to external terminals (e.g. a VDD pad and a VSS pad) of the integrated circuit. The integrated circuit may include other power pads and include signal pads (not shown), each with their own ESD protection circuits. The integrated circuit may include other circuitry such as e.g. processing, digital logic, analog circuitry, sensors, memories, mixed signal, drivers, and/or wireless circuitry. The integrated circuit may be packaged in an encapsulant (e.g. molding compound, resin) by itself or with other integrated circuits to form an integrated circuit package that is implemented in electronic systems. In such a package, rails VDD and VSS would be electrically coupled to external terminals (e.g. pads, pins, leads, bumps) of the integrated circuit package.

Figure 4:
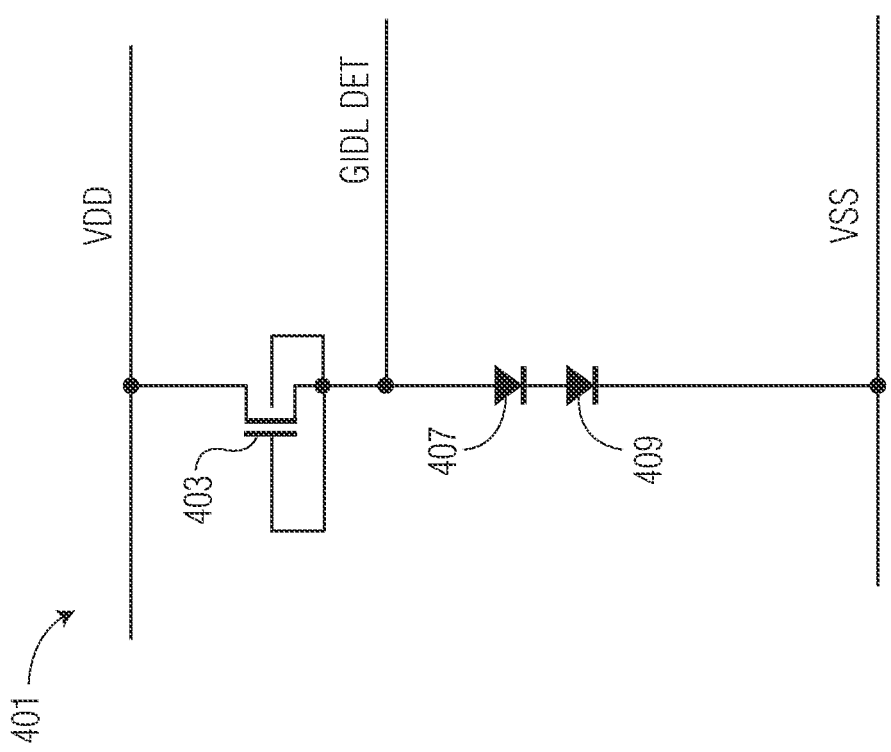
FIG. 4 is a circuit diagram of a GIDL detection circuit according to another embodiment of the present invention.

FIG. 4 is a circuit diagram of another embodiment of a GIDL detection circuit 401. Circuit 401 may be used in place of circuit 303 in FIG. 3. Circuit 401 includes a current path from the rail VDD to rail VSS. Located in the current path are detection NFET 403 and diodes 407 and 409. NFET 403 is configured with its body electrode connected to its source. Unlike GIDL detection circuit 303, the gate of NFET 403 is connected to it source.

Figure 5:
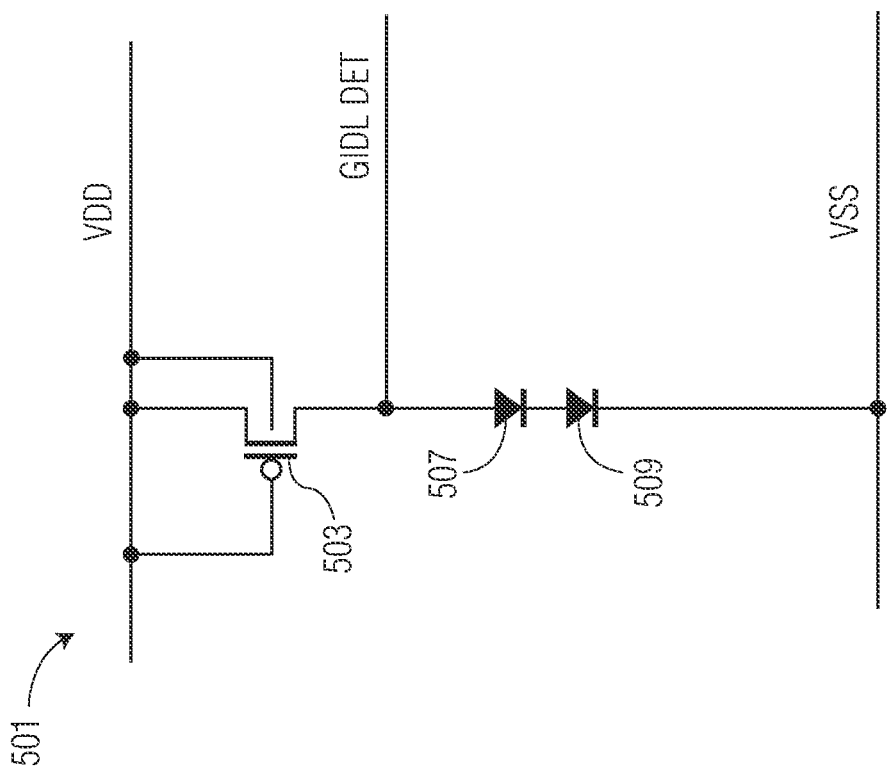
FIG. 5 is a circuit diagram of a GIDL detection circuit according to another embodiment of the present invention.

FIG. 5 is a circuit diagram of another embodiment of a GIDL detection circuit 501 that may be used in place of circuit 303 in FIG. 3. Circuit 501 includes a current path from rail VDD to rail VSS. Located in the current path are detection PFET 503 and diodes 507 and 509. PFET 503 is configured with its body electrode, gate, and source connected to the rail VDD.

Figure 6:
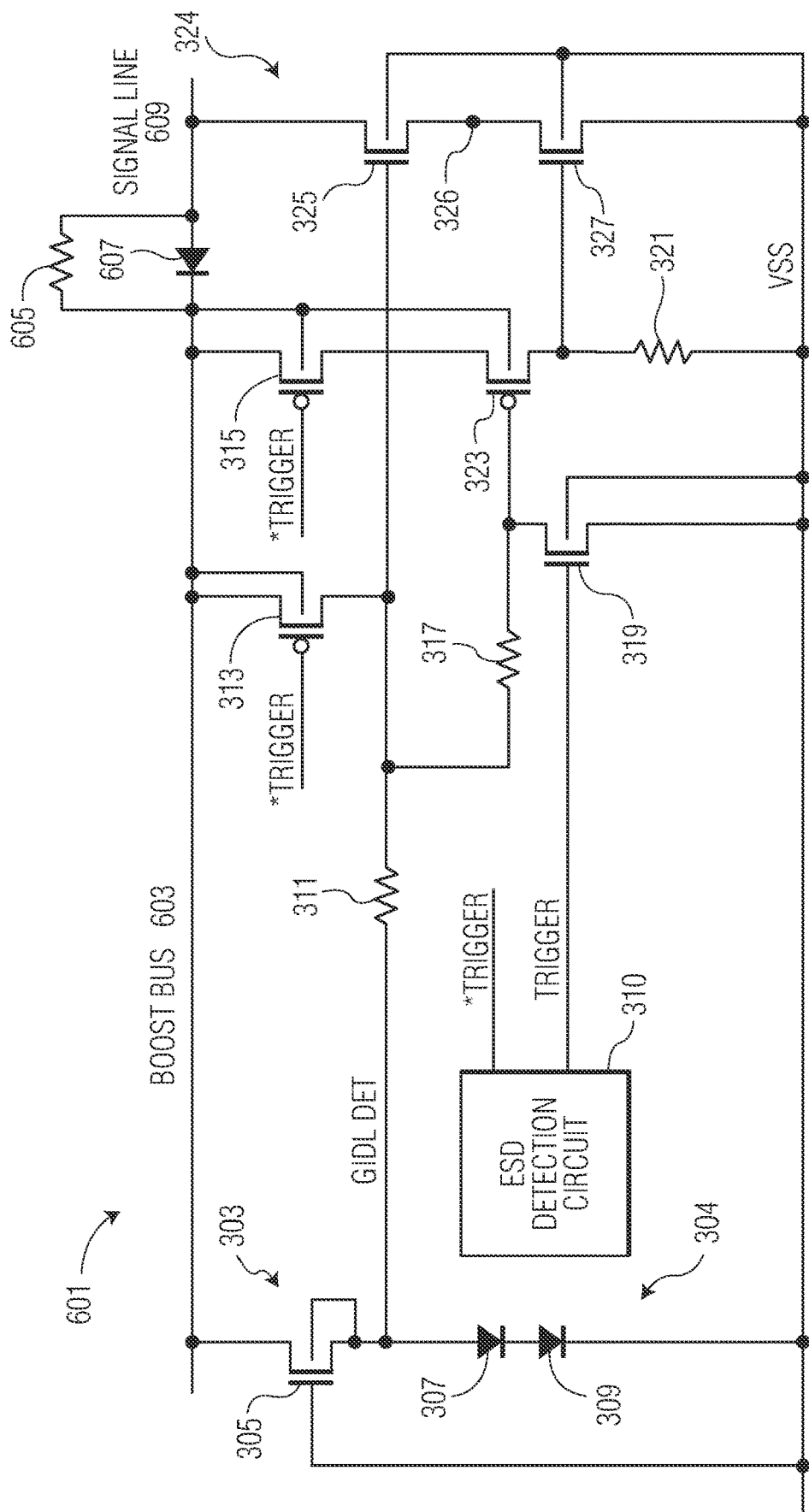
FIG. 6 is a circuit diagram of an ESD protection circuit according to another embodiment of the present invention.

FIG. 6 is a circuit diagram of another embodiment of an ESD protection circuit 601. The items in FIG. 6 having the same numbers as the items in FIG. 3 perform a similar function. In the embodiment of FIG. 6, items of the ESD protection circuit 601 are connected to a boost bus 603 instead of power supply rail VDD. Also, clamp path 324 discharges ESD current from signal line 609 instead of rail VDD. Although line 609 may be a power supply rail in other embodiments. Detection circuit 310 monitors boost bus 603 for ESD events. Also, GIDL detection circuit 303 and PFETs 313 and 315 are connected to boost bus 603. Boost bus 603 is coupled to the signal line 609 by a diode 607 and resistor 605 connected in parallel. Other embodiments would not include resistor 605. In still other embodiments, boost bus 603 and signal line 609 (or a power supply rail in some embodiments) may be coupled by other devices e.g. such as with a switch.

In some embodiments, the boost bus 603 is biased at a slightly higher voltage than signal line 609 (or power supply rail) during an ESD event so that the trigger circuitry has a higher drive voltage. During an ESD event that affects signal line 609, a higher voltage on signal line 609 will raise the voltage of boost bus 603 through diode 607.

In other embodiments, an ESD protection circuit may be configured differently, have different components, operate in a different manner, and/or protect different parts of an integrated circuit. For example, in some embodiments, a clamp path may include more than two clamp transistors. In other embodiments, the circuitry for controlling the conductivity of the clamp transistors (NFETs 325 and 327) may be different or have a different configuration. For example, circuit 301 may not include resistor 311. In other embodiments, a diode may be located in place of resistor 317. In still another embodiments, the GIDL DET signal may be provided to the gate of an NFET (not shown) whose drain is connected to the gate of NFET 325 as in a source follower configuration to control the voltage of the gate of NFET 325. In some embodiments, PFETs could be utilized as clamp transistors. In one such embodiment utilizing PFETs as clamp transistors, the GIDL detection signal would be used to control the voltage of the PFET located closest to VSS in the clamp path. In other embodiments, an ESD protection circuit may include other types of transistors (e.g. bipolar transistors).

As has been shown, implementing a GIDL detection circuit in an ESD circuit to make conductive a clamp transistor (e.g. 325) in the event of GIDL current conditions to inhibit GIDL current in the clamp path, may in some embodiments, advantageously provide for an ESD protection circuit that protects against GIDL current in the clamp path while only making conductive a clamp path transistor when GIDL current conditions exist, thereby saving power of a system. When no GIDL current conditions exist, no power is being consumed to generate voltages to bias the clamp transistor (NFET 325). As an example, the clamp paths of ESD protection circuits for signal lines would not be subject to potential GIDL currents when the signal lines are at low voltages (e.g. VSS). Thus, during these times, bias voltages to make a clamp transistor (e.g. NFET 325) conductive to reduce GIDL current is not needed.

Furthermore, such a system may be advantageous in that it provides for GIDL protection of an ESD clamp path that may be subject to a wide range of voltages during operation. In addition, in some embodiments where the GIDL DET voltage indicative of a GIDL current condition is generated by GIDL current through a detection transistor (e.g. FETs 305, 403, 503), additional power bias voltage generation circuitry (e.g. a resistor ladder, voltage regulator, bandgap generator) is not needed.

As shown in embodiments herein, the current paths of the GIDL detection circuits 303, 401, and 501 are independent of the clamp path 324 in that the GIDL current paths and the clamp path do not share a portion of the same path. This may be advantageous, especially at smaller process nodes where it becomes more difficult to couple multiple paths due to process limitations defined by design rule checks of the process node. Also, in some embodiments, having a GIDL detection circuit be independent of the clamp path may allow for a GIDL detection circuit to provide a GIDL detection signal for multiple clamp paths.

Features described herein with respect to one embodiment may be implemented in other embodiments described herein. A current electrode of a FET (field effect transistor) is a source or drain. A control electrode of a FET is a gate.

In one embodiment, an ESD protection circuit includes a clamp path between a first node and a second node. The clamp path includes a first clamp transistor and a second clamp transistor. The ESD protection circuit includes an ESD detection circuit for detecting an ESD event. The first clamp transistor and the second clamp transistor are made conductive in response to a detection of an ESD event by the ESD detection circuit for discharging ESD current from the ESD event between the first node and the second node. The ESD protection circuit includes a GIDL detection circuit including an output to provide a signal indicative of a GIDL current condition. The signal increases a conductivity of the first clamp transistor when the signal is indicative of a GIDL current condition to minimize a GIDL current through at least a portion of the clamp path when the second clamp transistor is nonconductive where no ESD current is being discharged from the first node to the second node through the clamp path.

In another embodiment, an ESD protection circuit includes a clamp path between a first node and a second node. The clamp path includes a first clamp FET and a second clamp FET. The ESD protection circuit includes an ESD detection circuit for detecting an ESD event. The first clamp FET and the second clamp FET are made conductive in response to a detection of an ESD event by the ESD detection circuit for discharging ESD current from the ESD event between the first node and the second node. The ESD protection circuit includes a GIDL detection circuit including a current path with a first FET located in the current path. A body electrode of the first FET is connected to a source of the first FET. The GIDL detection circuit includes an output to provide a voltage indicative of a GIDL current through the current path of the GIDL detection circuit. The voltage is utilized to control a voltage of a control electrode of the first clamp FET to increase a conductivity of the first clamp FET to minimize a GIDL current through at least a portion of the clamp path when the second clamp FET is nonconductive where no ESD current is being discharged from the first node to the second node.

In another embodiment, an ESD protection circuit includes a clamp path between a first node and a second node. The clamp path including a first clamp transistor and a second clamp transistor. The ESD protection circuit includes an ESD detection circuit for detecting an ESD event. The first clamp transistor and the second clamp transistor are made conductive in response to a detection of an ESD event by the ESD detection circuit for discharging ESD current from the ESD event between the first node and the second node. The ESD protection circuit includes a GIDL detection circuit including an output to provide a signal indicative of a GIDL current condition. The signal is utilized to control a voltage of a control electrode of the first clamp transistor to utilize the first clamp transistor in a source follower configuration to control a voltage of a node between the first clamp transistor and the second clamp transistor in the clamp path when the second clamp transistor is nonconductive where no ESD current is being discharged from the first node to the second node.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An ESD protection circuit comprising:
   a clamp path between a first node and a second node, the clamp path including a first clamp transistor and a second clamp transistor;
   an ESD detection circuit for detecting an ESD event, wherein the first clamp transistor and the second clamp transistor are made conductive in response to a detection of an ESD event by the ESD detection circuit for discharging ESD current from the ESD event between the first node and the second node;
   a GIDL detection circuit including an output to provide a signal indicative of a GIDL current condition, the signal increases a conductivity of the first clamp transistor when the signal is indicative of a GIDL current condition to minimize a GIDL current through at least a portion of the clamp path when the second clamp transistor is nonconductive where no ESD current is being discharged from the first node to the second node through the clamp path.

2. The ESD protection circuit of claim 1 wherein the GIDL detection circuit includes a current path to the second node, the GIDL current condition indicated by the signal is indicative of a GIDL current through the current path of the GIDL detection circuit.

3. The ESD protection circuit of claim 2 wherein the current path is from the first node.

4. The ESD protection circuit of claim 2 wherein the GIDL detection circuit includes a first transistor in the current path having a body electrode connected to a current electrode of the first transistor.

5. The ESD protection circuit of claim 4 wherein the first transistor includes a control electrode connected to the second node.

6. The ESD protection circuit of claim 4 wherein the first transistor includes a control electrode connected to the current electrode of the first transistor.

7. The ESD protection circuit of claim 4 wherein the first transistor is characterized as an NFET.

8. The ESD protection circuit of claim 4 wherein the first transistor is characterized as a PFET.

9. The ESD protection circuit of claim 4 wherein the GIDL detection circuit includes at least one diode located in the current path of the GIDL detection circuit between the first transistor and the second node.

10. The ESD protection circuit of claim 4 wherein the current electrode is a source electrode.

11. The ESD protection circuit of claim 1 wherein the output of the GIDL detection circuit is coupled to a control electrode of the first clamp transistor.

12. The ESD protection circuit of claim 11 wherein the output of the GIDL detection circuit is coupled to the control electrode of the first clamp transistor through a resistive element.

13. The ESD protection circuit of claim 1 wherein the signal controls first clamp transistor in a source follower configuration when the signal is indicative of a GIDL current condition to minimize a GIDL current through at least a portion of the clamp path when the second clamp transistor is nonconductive where no ESD current is being discharged from the first node to the second node through the clamp path.

14. The ESD protection circuit of claim 1 wherein a control electrode of the second clamp transistor is coupled to a first current electrode of a first transistor, a second current electrode of the first transistor is coupled to a first current electrode of a second transistor, a control electrode of the first transistor is coupled to the output of the GIDL detection circuit and a control electrode of the second transistor is coupled to an output of the ESD detection circuit that provides an indication of an ESD event.

15. The ESD protection circuit of claim 1 wherein the GIDL detection circuit includes a current path that is independent of the clamp path.

16. The ESD protection circuit of claim 1 wherein the first clamp transistor is located in the clamp path closer to the first node and the second clamp transistor located in the clamp path closer to the second node.

17. The ESD protection circuit of claim 1 wherein a first current electrode of the first clamp transistor is connected to a first current electrode of the second clamp transistor at a third node in the clamp path, wherein the signal controls the conductivity of the first clamp transistor when the signal is indicative of a GIDL current condition to adjust a voltage of the third node to a voltage that is between a voltage of the first node and a voltage of the second node to minimize a GIDL current through at least a portion of the clamp path when the second clamp transistor is nonconductive where no ESD current is being discharged from the first node to the second node.

18. An ESD protection circuit comprising:
a clamp path between a first node and a second node, the clamp path including a first clamp FET and a second clamp FET;
an ESD detection circuit for detecting an ESD event, wherein the first clamp FET and the second clamp FET are made conductive in response to a detection of an ESD event by the ESD detection circuit for discharging ESD current from the ESD event between the first node and the second node;
a GIDL detection circuit including a current path with a first FET located in the current path, a body electrode of the first FET is connected to a source of the first FET, the GIDL detection circuit including an output to provide a voltage indicative of a GIDL current through the current path of the GIDL detection circuit, the voltage is utilized to control a voltage of a control electrode of the first clamp FET to increase a conductivity of the first clamp FET to minimize a GIDL current through at least a portion of the clamp path when the second clamp FET is nonconductive where no ESD current is being discharged from the first node to the second node.

19. An ESD protection circuit comprising:
a clamp path between a first node and a second node, the clamp path including a first clamp transistor and a second clamp transistor;
an ESD detection circuit for detecting an ESD event, wherein the first clamp transistor and the second clamp transistor are made conductive in response to a detection of an ESD event by the ESD detection circuit for discharging ESD current from the ESD event between the first node and the second node;
a GIDL detection circuit including an output to provide a signal indicative of a GIDL current condition, the signal is utilized to control a voltage of a control electrode of the first clamp transistor to utilize the first clamp transistor in a source follower configuration to control a voltage of a node between the first clamp transistor and the second clamp transistor in the clamp path when the second clamp transistor is nonconductive where no ESD current is being discharged from the first node to the second node.

20. The ESD protection circuit of claim 19 wherein:
the first clamp transistor and the second clamp transistor are each characterized as FETs;
the signal decreases a magnitude of a drain to gate voltage of the first clamp transistor when the signal is indicative of a GIDL current condition.

* * * * *